United States Patent
Berner et al.

(10) Patent No.: US 6,947,311 B2
(45) Date of Patent: Sep. 20, 2005

(54) TWO-DIMENSIONAL STRUCTURAL TRANSITION CONTROLLED BY AN ELECTRIC FIELD, MEMORY STORAGE DEVICE THEREOF, AND METHOD OF MAKING A MEMORY STORAGE DEVICE

(75) Inventors: Simon Berner, Basel (CH); Silvia Schintke, Basel (CH); Luca Ramoino, Basel (CH); Michael de Wild, Basel (CH); Thomas A. Jung, Basel (CH)

(73) Assignee: University of Basel, Basel (CH)

( * ) Notice: Subject to any disclaimer, the term of this patent is extended or adjusted under 35 U.S.C. 154(b) by 0 days.

(21) Appl. No.: 10/863,593

(22) Filed: Jun. 9, 2004

(65) Prior Publication Data

US 2005/0002222 A1 Jan. 6, 2005

Related U.S. Application Data

(60) Provisional application No. 60/477,062, filed on Jun. 10, 2003.

(51) Int. Cl.[7] .............................. G11C 11/23; G11B 7/24
(52) U.S. Cl. ...................... 365/151; 365/113; 365/118; 365/163; 365/217; 365/237; 977/DIG. 1; 438/36; 430/270.17; 430/275.1
(58) Field of Search ................................. 365/151, 108, 365/113, 118, 153, 163, 217, 237; 977/DIG. 1; 438/36, 22; 430/270.17, 275.1, 296

(56) References Cited

U.S. PATENT DOCUMENTS

| | | | | |
|---|---|---|---|---|
| 4,032,901 A | * | 6/1977 | Levinthal ..................... | 365/118 |
| 5,444,651 A | | 8/1995 | Yamamoto et al. .......... | 365/108 |
| 5,547,774 A | * | 8/1996 | Gimzewski et al. . | 428/694 ML |
| 5,557,596 A | * | 9/1996 | Gibson et al. ............... | 369/101 |
| 6,101,164 A | | 8/2000 | Kado et al. .................. | 369/126 |
| 6,392,725 B1 | | 5/2002 | Harada et al. ................ | 349/74 |
| 6,803,660 B1 | * | 10/2004 | Gates et al. ................. | 257/758 |
| 2002/0176276 A1 | * | 11/2002 | Zhang et al. ................ | 365/151 |

FOREIGN PATENT DOCUMENTS

| | | | |
|---|---|---|---|
| EP | 0 665 541 A2 | 8/1995 | ........... G11B/11/00 |
| EP | 1 170 147 A1 | 1/2002 | ............. B41M/5/26 |
| EP | 1 233 418 A1 | 8/2002 | ........... G11C/11/34 |

OTHER PUBLICATIONS

Gao et al.: Reversible, Nanometer–Scale Conductance Transitions in an Organic Complex. Phys. Rev. Lett., vol. 84, pp. 1780–1783, Feb. 2000.

Jung et al.: Controlled Room–Temperature Positioning of Individual Molecules: Molecular Flexure and Motion. Science, vol. 271, pp. 181–184, Jan. 1996.

* cited by examiner

*Primary Examiner*—Andrew Q. Tran
(74) *Attorney, Agent, or Firm*—Griffin & Szipl, P.C.

(57) ABSTRACT

This invention relates to the controlled two-dimensional structural transition of a dipole monolayer at a metal, semi-conducting or insulating interface. The dipole monolayer consists of objects/molecules with a permanent electric dipole moment. A transition between the structures of the molecular layer can be performed locally and reversibly by applying an electrical field and the structures/patterns can be reversibly switched many times between two different structures/states. Both of the two structures, the ordered and the disordered structures, are intrinsically stable without the presence of the switching electrical field. This controlled switch of the local layer structure can be used to change layer properties (i.e., mechanical, electrical, optical properties). The controlled reversible modifications of the dipole monolayer structures are usable as bit assignments in data storage applications for example.

36 Claims, 9 Drawing Sheets

STORAGE

SWITCHABLE MIRROR

SWITCHABLE MIRROR

SWITCHABLE LUBRICANT

SWITCHABLE LUBRICANT

TWO-DIMENSIONAL STRUCTURAL TRANSITION CONTROLLED BY AN ELECTRIC FIELD, MEMORY STORAGE DEVICE THEREOF, AND METHOD OF MAKING A MEMORY STORAGE DEVICE

The present application for patent claims priority under 35 U.S.C. § 119(e) to U.S. Provisional Application No. 60/477,062, filed on Jun. 10, 2003, and which is incorporated herein by reference in its entirety.

FIELD OF THE INVENTION

The present invention relates to a molecular dipole layer that has the property of ordering into different structures on a metallic, semi-conducting or insulating substrate. Also, in accordance with the present invention, a method of reversibly changing the structure of the molecular dipole layer into the different structures by applying a selectively polarized electric field is described. Both the molecular dipole layer and the method of reversibly switching between various structures using a selectively polarized electric field can be applied to a variety of usages such as the manufacture of patterned layers with specific electrical, optical and mechanical properties for lithography, data storage and display technology (i.e., switching mirrors, switchable lubricants, active large screens similar to LCD displays).

BACKGROUND OF THE INVENTION

The dramatic progress of the computer technology over the last four decades has been fueled by an unparalleled development of the basic hardware elements: storage devices, processors and displays. In all three areas, the art and science of surface structuring is of essential importance. Technology trends towards miniaturization and integration, as well as towards improved performance, reliability and productivity require increasingly better control of surfaces and interfaces down to the molecular or atomic level.

Recently, research directed to the controlled fabrication of small structures has been greatly inspired by the success of scanning probe microscopes (hereafter, "SPM"). Numerous examples confirm that the pointed probe tip of the SPM is not only able to monitor variations in the sample surface structure with atomic or near-atomic resolution, but it also can be used to modify the surface on a similar atomic or molecular scale. It was demonstrated by T. A. Jung, R. R. Schlittler, J. K. Gimzewski, H. Tang, and C. Joachim in Science, Vol. 271, p. 181, 1996, for instance, that individual molecules can be moved into prescribed fixed new positions and/or be modified without change of position under the influence of the SPM tip. In the pursuit of such investigations, it was found that molecular flexibility and diffusibility plays an important role for such molecular repositionings.

Fixed ordered molecular layers on a substrate are generated, e.g. by molecules forming Langmuir-Blodgett (LB) films, or self-assembled monolayer (SAM) films, or by undergoing cooperative self-assembly, or by being deposited by sublimation or by molecular beam epitaxy. The assembly within the molecular overlayer is driven by molecule-substrate interaction, as well as covalent or non-covalent intermolecular forces. Depending on the roughness of the atomic surface potential, at a given temperature, single molecules can diffuse over the substrate or are immobilized. Within a grown self-organized molecular superstructure, the individual molecules cannot move due to local forces and are fixed by their local environment.

One of the most used storage devices at the moment is the hard-disc, which uses magnetic units to store information. Single bits are realized by a certain area of magnetizable material. The magnetization of these bits are changed and read out by a head. The bits are arranged in tracks on a disc, which is spinning fast around its axis. Different patents and prior art references exist that cover the idea of writing in a "phase change medium" by applying voltage pulses. However, usually bulk material is used to achieve these methods and the mechanism of changing the structure is often induced by resistive heat. Also, erasing often is performed by heating as described in the following examples:

"Information recording and reproducing" describes a phase change material, wherein change of the phase is obtained by the resistive heat of the flowing current (by applying a voltage) as disclosed in EP0665541 A2 and U.S. Pat. No. 6,101,164.

"Phase change media for ultra-high-density data-storage devices" describes two solid phases, wherein transition between the phases occurs by heating the bit storage region as disclosed in EP1233418 A1.

"Non-volatile memory device" describes a liquid crystal that is heated by a pair of electrodes, thereby changing the phase as disclosed in U.S. Pat. No. 5,444,651.

Liquid crystals are a form of matter that lie in-between disordered liquids and ordered crystals. They are created mostly using long stretched molecules of about 10 to 100 atoms, which have one or more benzene rings or double bonds in their center. Liquid crystals were invented more than a 100 years ago, but were investigated more precisely only the last three decades when their technical usage grew important. Today, more than 10,000 types of molecules are known for building such liquid crystals. The molecules of the liquid crystals can arrange in several different sterical configurations; and, although these patterns look rather crystalline, they have typical properties of a liquid. For instance, the viscosity of liquid crystals is on the order of $0.01$ kg m$^{-1}$ s$^{-1}$, with a vanishing elastic modulus and a rate of change of spatial location (i.e., "hopping rate") of $10^{-7}$ s. The molecules can be shifted relatively easily between each other, but keep their parallel spatial arrangement.

A Liquid-Crystal Display (hereafter, "LCD") mainly contains a 50–100 $\mu$m thick layer of a nematic liquid between two crossed optical polarization filters. The orientation of the molecules at the contact area (e.g., boundary surface orientation, or "Grenzflächenorientierung") is turned 90° with respect to each other and is equivalent to the direction of the light polarization of the filters. Without an electrical field, light can travel through the device. With an applied electrical field, the molecules in the center of the device are turned into the direction of the field. The light meets the second polarization filter without a rotation of the direction of the polarization and therefore is adsorbed there.

However, the prior art liquid crystal devices have the following drawbacks. First, they require a three-dimensional structural transition that is a relatively bulky, multilayer structure that is about 50–100 $\mu$m thick. Second, the device needs to have fixed top and bottom electrodes in order to provide an electric field and these electrodes must be selected based upon the properties at the interface between the liquid crystal and the electrode. Third, the switching effect achieved by liquid crystals is based on a rotation of individual molecules that are located at a fixed position, although the molecules have a high rate of change of spatial location of $10^{-7}$ s, which is also referred to as the "hopping rate."

"Information recording medium and method for manufacturing the same" describes a reversible phase change between electrically or optically detectable states that is caused by electric energy, or electromagnetic energy, in lattice defects (at least a part of the lattice defect has to be filled with an element other than an element constituting the crystal structure) as disclosed in EP 1170147 A1.

"Systems and methods for providing a storage medium" describes cholesteric liquid crystals having a plurality of display layers wherein texture is changed by applying voltages as disclosed in U.S. Pat. No. 6,392,725 B1. However, this patent is another example of a three-dimensional device.

Other approaches that use a bulk 3-dimensional dipolar material to store data are disclosed in "Reversible, Nanometer-Scale conductance transitions in an organic complex," which describes molecules with a permanent dipole moment forming a 3-dimensional thin film (approx. 20 nm thick), that has a local reversible structural transition induced by an electric field with phase transition between ordered-disordered states as disclosed in Gao et al., Phys. Rev. Lett. 84 (2000) 1780.

SUMMARY OF THE INVENTION

In accordance with a first apparatus embodiment of the present invention, a memory storage device is provided that includes: (a) a substrate; and (b) a two-dimensional molecular dipole layer disposed on the substrate and provided by molecules having a permanent electric dipole moment, wherein the molecules of the dipole layer form two different two-dimensional structures, wherein a first structure is an ordered structure and a second structure is a disordered structure.

In accordance with a second apparatus embodiment of the present invention, a two-dimensional dipole layer disposed on a substrate is claimed, wherein the two-dimensional dipole layer comprises: molecules having a permanent electric dipole moment and that adsorb to a surface of a substrate, wherein the molecules of the dipole layer form two different two-dimensional structures, wherein a transition between these two structures can be reversibly induced by the influence of an electric field.

In accordance with a third apparatus embodiment of the present invention, there is provided a memory storage device including (a) a substrate; (b) a two-dimensional molecular dipole layer disposed on the substrate and provided by molecules having a permanent electric dipole moment, wherein the molecules of the dipole layer form different two-dimensional structures, wherein a first structure is an ordered structure and a second structure is a disordered structure; and (c) at least one electrode disposed near the dipole layer so that a local electric field is produced between the electrode and the substrate, wherein the local electric field has a component that has a first polarity and a first field strength that orders a first region of the dipole layer to form the first structure and the local electric field is switchable to have a component that has a second polarity and a second field strength that transforms the first region of the dipole layer to form the second structure.

In accordance with a fourth apparatus embodiment of the present invention, a two-dimensional dipole layer disposed on a substrate is described, wherein the two-dimensional dipole layer includes: molecules having a permanent electric dipole moment and that adsorb to a surface of the substrate, wherein the molecules of the dipole layer form different two-dimensional structures that include a first structure and a second structure, wherein the dipole moment has a component perpendicular to the surface of the substrate, and wherein application of a first electric field to the dipole layer so that a component of the first electric field is parallel with the perpendicular component of the dipole moment transforms the dipole layer into the first structure, whereas application of a second electric field to the dipole layer so that a component of the second electric field is anti-parallel with the perpendicular component of the dipole moment transforms the dipole layer into the second structure.

In a fifth apparatus embodiment in accordance with the present invention, the fourth apparatus embodiment is further modified so that the first structure is an ordered crystalline structure and the second structure is a non-ordered, non-crystalline structure.

In a sixth apparatus embodiment in accordance with the present invention, the fifth apparatus embodiment is further modified so that the parallel component of the first electric field has a first electric field strength and the anti-parallel component of the second electric field has a second electric field strength.

In a seventh apparatus embodiment in accordance with the present invention, the sixth apparatus embodiment is further modified so that the first electric field strength is different in magnitude from the second electric field strength.

In accordance with a first method embodiment of the present invention, there is provided a method of manufacturing a memory storage device that includes the steps of: (a) creating a substrate that includes a prepattern; (b) depositing molecules that have a permanent electric dipole moment onto the surface of the prepatterned substrate so as to form a two-dimensional dipole monolayer, wherein the molecules of the dipole monolayer form two different two-dimensional structures that include a first structure and a second structure, wherein the first structure is an ordered, crystalline structure and the second structure is a disordered, non-crystalline structure; and (c) applying a local electric field to one or more regions of the dipole monolayer, wherein application of an electric field having a first polarity essentially parallel to the electric dipole moment, which is perpendicular to the surface of the prepatterned substrate, transforms a corresponding region into the ordered structure whereas application of an electric field having a second polarity essentially anti-parallel to the electric dipole moment component perpendicular to the surface of the prepatterned sustrate transforms the corresponding region into the disordered structure.

In accordance with a second method embodiment of the present invention, there is provided a method of storing data is claimed that includes the steps of: (a) providing a memory storage device manufactured in accordance with the method of the first method embodiment; and (b) applying the local electric field to one or more regions of the dipole monolayer so as to write data onto the dipole monolayer, wherein regions that have ordered structure are assigned a bit structure of "1" and regions that have disordered structure are assigned a bit structure of "0", or vice versa.

In summary, the present invention relates to the application of a two-dimensional molecular assembly, that is a molecular monolayer at an interface towards a substrate for data storage, as a new type of resist, as a surface with changeable properties or in the context of various molecular devices. The principle of operation is switching between a structural property of a molecular two-dimensional layer by using a local electrical field applied between an electrode and the substrate. More particularly, the present invention utilizes a reversible structural transition brought about through selective functional design of the molecular overlayer and by considering the relevant properties of the interfacing substrate. Present embodiments in accordance with the present invention include ultra-high-density storage devices, lithography applications and optical applications.

The molecules used in the present invention can be synthesized using existing methods. The immobilization of these molecules at the substrate surface enables the use of micro- and nano-fabrication tools and methods for optional further processing. The disclosed molecule, structured medium, and methods enable a broad applicability, and a variety of combinations with other established and exploratory methods. The large variety of molecules that fall into the class of the disclosed molecules as well as the large variety of the disclosed substrates enables broad range of applications and combinations with other established and exploratory techniques.

Further objects, features and advantages of the present invention will become apparent from the Detailed Description of the Illustrative Embodiments, which follows, when considered together with the attached drawings.

BRIEF DESCRIPTION OF THE DRAWINGS

FIGS. 3a–d schematically illustrate two-dimensional structural transitions between two different molecular structures, wherein FIG. 3a shows a two-dimensional structural transition between two different ordered structures.

FIG. 3b shows a two-dimensional structural transition between an ordered structure and a disordered, amorphous structure.

FIG. 3c shows a two-dimensional structural transition between an ordered structure and a disordered structure comprising of mobile molecules or a 2D gas.

FIG. 3d shows a two-dimensional structural transition between a disordered, amorphous structure and a disordered, mobile molecular structure.

FIGS. 4a–e illustrate two-dimensional structural transitions reversibly induced by the electric field between an electrode and the substrate, wherein FIG. 4a shows a two-dimensional ordered structure and an electrode placed over the structure without disturbing the structure (i.e., the electric field is off or is not strong enough to induce a structural transition).

FIG. 4b shows a two-dimensional structural transition induced by the electric field having field strength A1 with polarity A.

FIG. 4c shows a two-dimensional disordered structure wherein the electrode is placed over the structure without disturbing the structure (i.e., the electric field is off or is not strong enough to induce the transition).

FIG. 4d shows a two-dimensional structural transition induced by the electric field having field strength B1 with polarity B that is opposite to polarity A.

FIG. 4e shows a two-dimensional ordered structure, (as in FIG. 4a), wherein the electrode is placed over the structure without disturbing the structure (i.e., the electric field is off or is not strong enough to induce the transition).

FIGS. 5a–c schematically illustrate electrodes for applying the electric field between electrode and substrate in accordance with the present invention wherein FIG. 5a shows a SPM (STM, AFM, SNOM, and related methods) tip used as an electrode that can be scanned over the surface of the substrate.

FIG. 5b illustrates multiple electrodes in an array of electrodes.

FIG. 5c illustrates multiple electrodes in an array of electrodes where each electrode can be separately controlled so that for each electrode the structural transition can be separately controlled in a small area. In FIG. 5c, "A" is an electric field with strength A1 and polarity A; "B" is an electric field with strength B1 and polarity B (opposite to polarity A); and "0" is no electric field.

FIGS. 7a–d illustrate how the two-dimensional structural transition is induced on a Cl-SubPc layer on Ag(111) substrate, wherein the STM is used as both an imaging tool and as a tool to induce the structural transition, wherein FIG. 7a shows a two-dimensional disordered structure, FIG. 7b shows a first transition induced by the electric field of the STM tip, FIG. 7c shows the two-dimensional ordered structure, and FIG. 7d shows a second transition induced by the electric field of the STM tip.

FIGS. 11a–c schematically illustrate a lithographic application of patterning molecular layers that uses the 2D structural transition properties to pattern a molecular layer, wherein FIG. 11a shows a two-dimensional ordered structure, FIG. 11b shows that the two-dimensional ordered structure can be locally transformed to a two-dimensional disordered structure, and FIG. 11c shows that, by irradiation with photons or other particles, or by chemical treatment, or by heating of the sample surface, the molecules in the disordered structure can be removed so that only the ordered structures remain on the sample surface.

DETAILED DESCRIPTION OF ILLUSTRATIVE EMBODIMENTS

Figure 1:
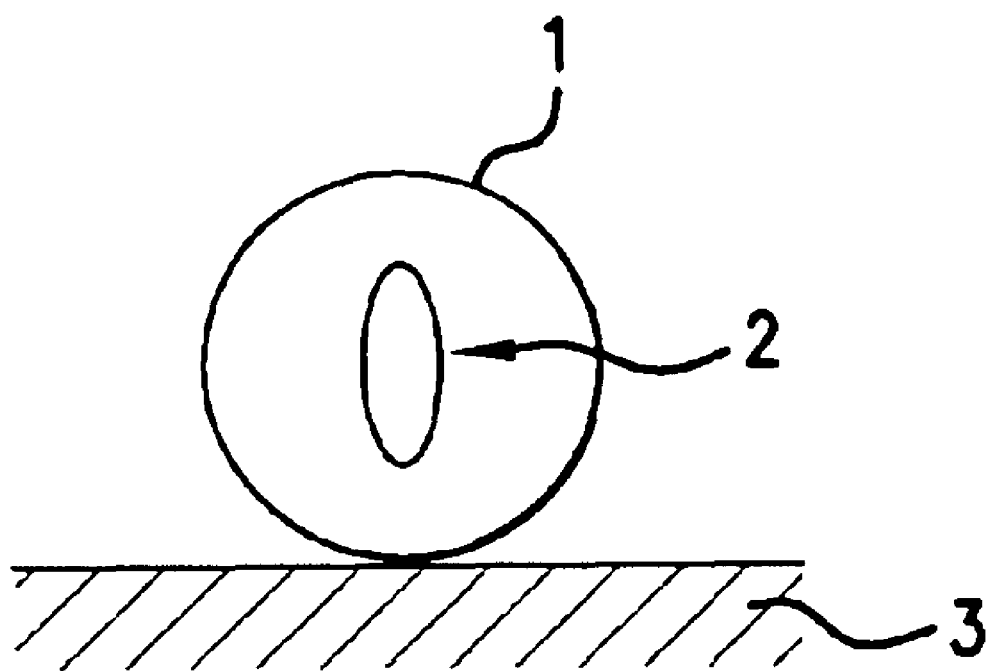
FIG. 1 illustrates a schematic object molecule (1), which has a permanent dipole moment (2), on a substrate (3).

The present invention utilizes a mono-layer, or sub-monolayer, of molecules that have a permanent dipole moment with a reversible structural transition property so as to provide novel high density memory devices, locally switchable mirror surfaces, locally switchable surface lubricants, lithographic applications for patterning molecular layers, and lithographic applications for substrate patterning. Thus, the present invention can also be used for the controlled change of local surface properties in a variety of different applications. Memory devices manufactured using a dipole layer in accordance with the present invention are electrically addressable thereby permitting effective reading and writing, and provide a high memory density (e.g. $10^{12}$ bits/inch$^2$).

To facilitate an easy understanding of the present invention, certain terms used are defined below. Then, a class of molecules having permanent dipole moments and which show a reversible transition between different structures in a molecular monolayer will be described, followed by a description of several non-limiting applications that utilize the class of molecules having permanent dipole moments with reversible structural transition properties.

Definitions

For the purposes of this disclosure, the following definitions are provided:

The term "two-dimensional structure" refers to a structure with mono-molecular height.

The term "monolayer" refers to a structure with mono-molecular height.

The term "dipole layer" refers to a 2-dimensional layer consisting of molecules and/or objects that have a permanent electric dipole moment.

The term "structural transition" refers to the change of a structure in any sense, e.g. arrangement, composition, symmetry, mobility, spreading, dispersion, and allocation, all with its specific properties.

The term "reversible structural transition" refers to a process that repeatedly transforms one structure into the other and vice versa.

The term "electrode" refers to any medium capable of transporting charge (e.g. electrons) to and/or from a storage molecule or storage layer. Preferred electrodes are metals or conductive organic molecules. The electrodes can be manufactured to virtually any 2-dimensional (2D) or 3-dimensional (3D) shape (e.g. discrete lines, pads, planes, spheres, cylinders, etc.).

The term "electric field" refers to voltage applied between an electrode and the surface upon which the dipole layer is disposed, wherein the electric field is provided with a specific strength, and polarity and 3-dimensional shape of its field-lines.

The term "storage medium" refers to a composition comprising a molecular storage layer in accordance with the present invention, preferably bonded to the substrate.

The term "read" refers to determining the structural order of the molecular overlayer by any method or process.

The term "write" refers to the process of changing the structure of a 2-dimensional molecular layer by using an electric field.

A "substrate" is a preferably solid material suitable for the attachment of a molecular layer such as a dipole layer. Substrates can be formed of materials including, but not limited to, metals, glass, plastic, silicon, minerals (e.g. quartz), semi-conducting materials, ceramics, etc. The substrate must be built in a way that it can be used as one of the electrodes.

Class of Molecules with Permanent Dipole Moment

Figure 2A:
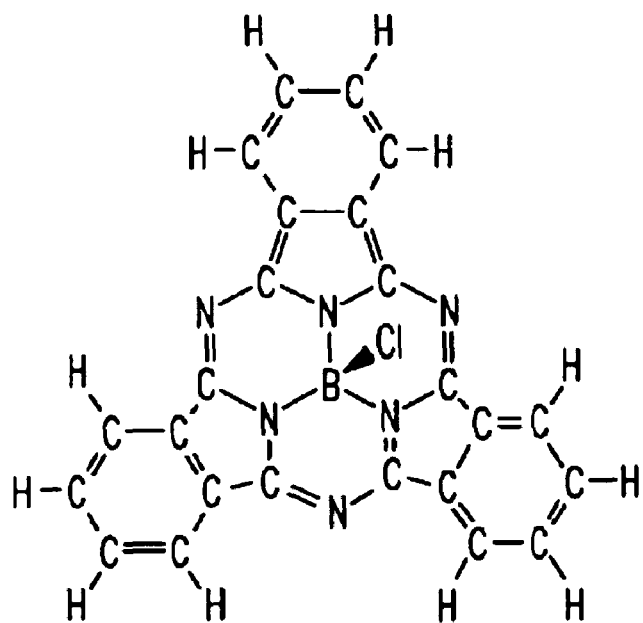
FIG. 2a illustrates the chemical structure of chloro [subphthalocyaninato]boron(III), $ClBN_6C_{24}H_{12}$, which is one molecule having dipole moment properties suitable for practicing the present invention.
Figure 2B:
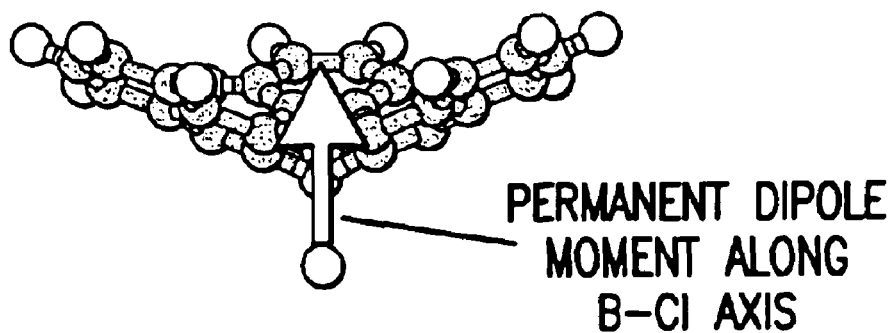
FIG. 2b illustrates a side view of the three dimensional geometric structure of Cl-SubPc, wherein the permanent dipole moment is oriented along the B-Cl axis as shown by the dark arrow.
Figure 3A:
Figure 3B:
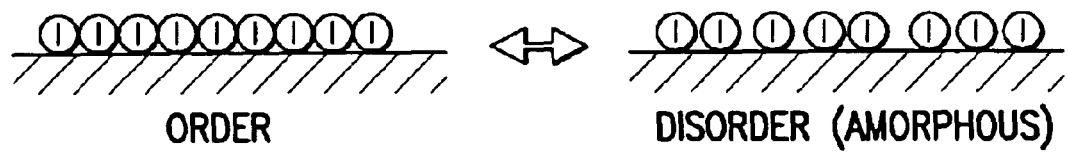
Figure 3C:
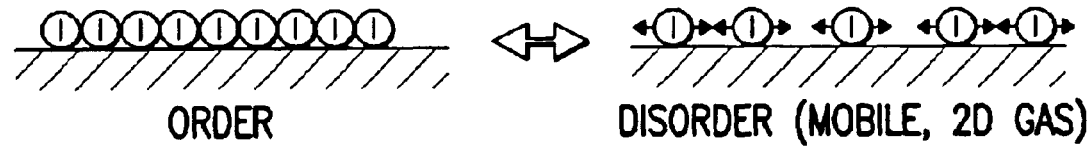
Figure 3D:
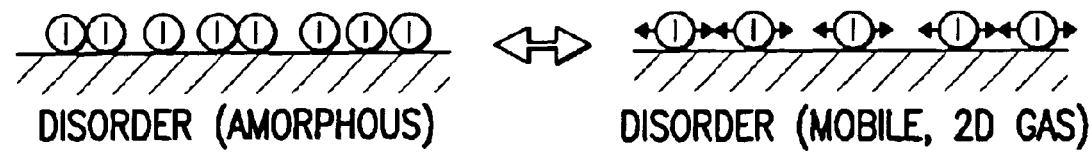

It is a first object of the present invention to provide a class of molecules that are attachable to a substrate and that possess an intrinsic permanent electric dipole moment as illustrated in FIG. 1. A suitable class of molecules for practicing the present invention should, at least after treatment of the deposited layer with a certain electric field applied by a SPM tip, provide a dipole layer comprising the suitable molecular class that should condense into a stabilized pattern. One such class of suitable molecules is substituted phthalocyanines, (abbreviated "SubPc"), of which chloro[subphthalocyaninato]boron(III) (abbreviated "Cl-SubPc"), as illustrated in FIGS. 2a and 2b, is an example. Other substituted phthalocyanines can be used to practice the present invention. For example, different ligands, such as an additional —$CH_3$ group, can be substituted to the chloro [subphthalocyaninato]boron(III) molecule.

Figure 7:
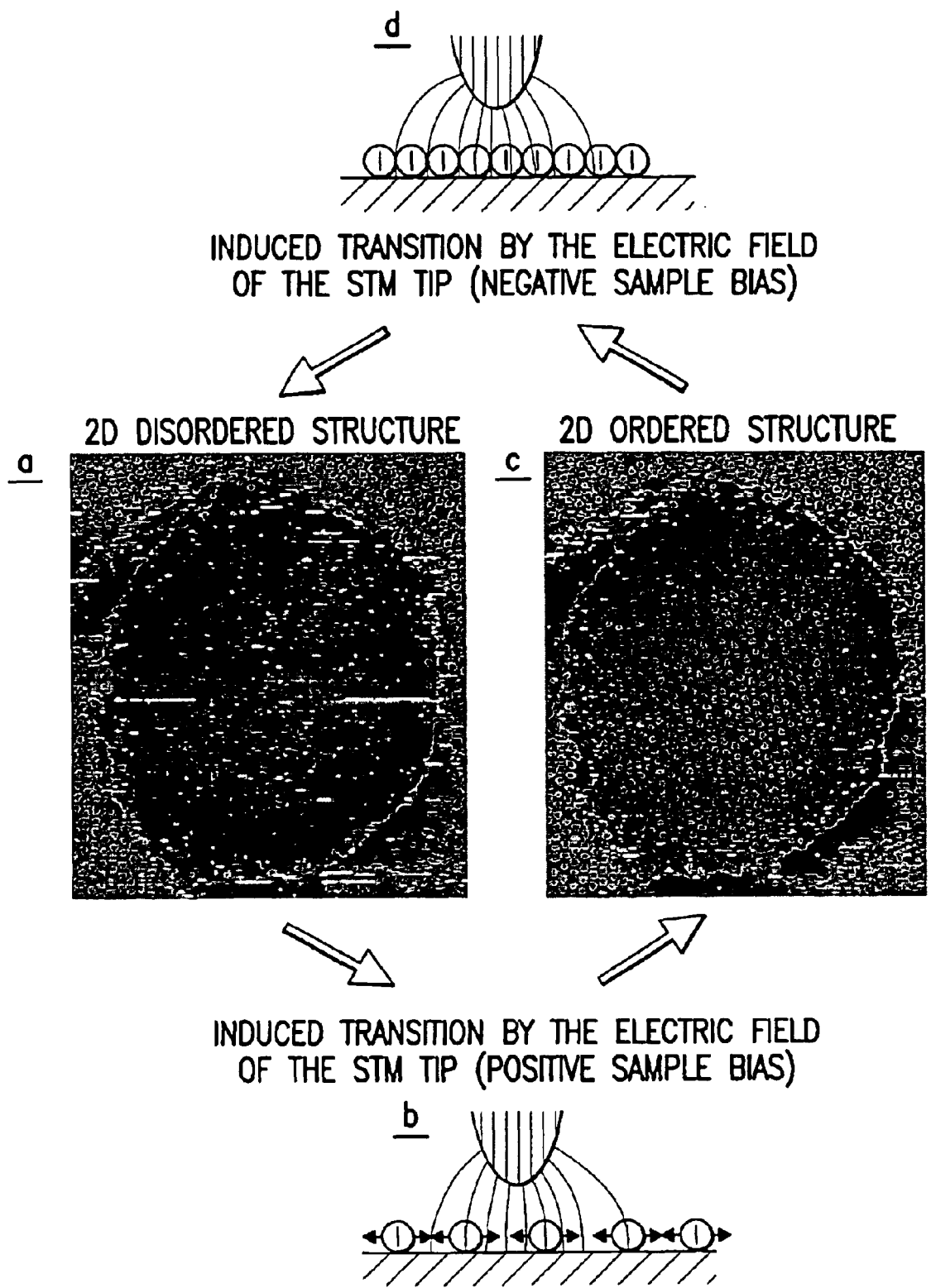

Cl-SubPc molecules are commercially available (Sigma-Aldrich Chemie Gmbh Munich, Germany) and have a permanent electric dipole moment of about 1.0 electron-angstroms (eÅ). FIG. 7, for example, shows a dipole layer comprising Cl-SubPc freshly deposited onto a (111)-oriented Ag crystal surface in ultrahigh vacuum, manifesting a structural order in a hexagonal close-packed pattern directly after deposition at room-temperature.

Appropriate combination of different molecular entities allows those skilled in the art to design other classes of molecules that match the requirements of a certain application. Specifically, other suitable classes of molecules that can be used to practice the dipole layer in accordance with the present invention must have an electric dipole moment of about 0.1 electron-angstroms (eÅ) or greater; otherwise, the electric dipole moment is not of sufficient strength to induce structural changes when exposed to an electric field. In addition, molecules suitable for practicing the present invention preferably have a large π electron system so that the electrons are delocalized over several atoms in the molecule, although this molecular characteristic is not necessarily required. Other characteristics of molecules besides the electric dipole moment, such as the diffusibility, the condensation barrier, the chemical activity, the electrical conductivity, the color, the molecular dimension, the strength of the adhesion to the substrate and the pattern of the condensed, ordered structure can be selected for best operation on a specific substrate depending upon the demands of the specific application.

Fabrication and Characterization of the Memory Storage Device

The memory devices in accordance with this invention can be fabricated using standard methods well known to those of skill in the art. In a preferred embodiment, all the steps are done in ultra-high vacuum (abbreviated as "UHV"). The metallic Ag(111) substrate is sputtered at 600 eV with Ar$^+$ ions for 0.25 h and annealed up to 300° C. for 0.5 h. The atomically clean and flat surface can be characterized by known methods from the surface science field such as Low Energy Electron Diffraction (abbreviated as "LEED"), Scanning Tunneling Microscope (abbreviated as "STM"), X-Ray Photoelectron Spectroscopy (abbreviated "XPS") or other surface science techniques.

When the substrate is clean in sense of crystallography, chemistry and topology, it can be structured (i.e., patterned) by means of lithography, focused ion beam, micro-contact printing or other methods.

The substrate can be structured (i.e., patterned) in order to provide special sites or confinements (i.e., holes) for the molecular dipole layer. Holes of mono-atomic height can be created by bombarding the surface with Ar$^+$ ions. The hole size can be chosen by altering the sputtering time. In addition, holes can be formed by X-ray irradiation, electromagnetic irradiation, electron beam irradiation, particle beam irradiation, etching, chemical removal, solvent removal, plasma treatment or any combination of these various techniques.

Then, the molecular dipole layer is vacuum deposited using molecular beam epitaxy or other known methods for depositing a molecular dipole monolayer. For example, the SubPc molecules, or other suitable class of molecules, are thermally evaporated from a solid source in the vacuum, or by electron beam evaporation, or are sprayed into the vacuum chamber, or are deposited in a mass-selected manner through a mass-spectrometer, or by laser ablation, or by matrix assisted methods, or are deposited in a solvent. The dipole molecules disposed on the substrate surface may arrange then in patterns, may self-organize into structures, may desorb again, may diffuse within 2 dimensions, or may undergo further chemical processes.

It is not necessary, but the substrate may be pre-patterned, which can lead to special situations on the surface. The dipole molecules, for example, will arrange within sputter defects that can be created artificially in the pre-patterned substrate.

Figure 6:
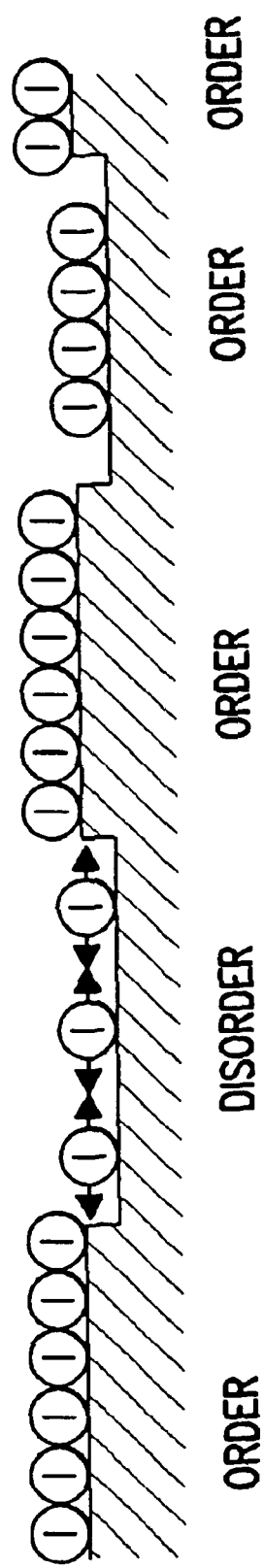
FIG. 6 illustrates a pre-patterned substrate, wherein the pre-patterning of the substrate leads to local confinements for the molecules.

FIGS. 2a and 2b show Cl-SubPc molecules that form a two-dimensional dipole layer (i.e., a 2D layer consisting of molecules/objects with a permanent dipole moment) in Ag(111) vacancy islands such as shown in FIG. 6. The SubPc molecules bind to the substrate surface by the molecule-substrate interaction, which is strong enough that the SubPc molecules can not desorb at room temperature. From FIG. 7, it can be seen how the two dimensional structural transition is induced on a Cl-SubPc layer on Ag(111). During manufacturing of the memory storage device such as shown in FIG. 6, sputter defects are introduced into the bare substrate prior to molecular deposition of the dipole monolayer. These sputter defects lead to mono atomic vacancy islands that act as a confinement (i.e., holes) for the Cl-SubPc molecules. The permanent dipole moments of the Cl-SubPc molecules naturally orient themselves to point away from the substrate surface. The structure of the molecular layer in such vacancy islands can be reversibly changed between an ordered and a disordered structure. The transition is induced by the electric field of the STM tip. For positive sample bias (i.e., STM tip negative, substrate surface positive) a component of the electric field is oriented essentially parallel to the electric dipole moment, (or at least to the component of the electric dipole moment that is perpendicular to the surface), which leads to the ordered structure. For negative sample bias (i.e., STM tip positive, substrate surface negative), a component of the electric field is oriented essentially anti-parallel to the electric dipole moment (or at least to the component of the electric dipole moment that is perpendicular to the surface), which leads to the disordered structure. The two different structures are intrinsically stable in the vacancy islands and are observable at room temperature using the STM.

Figure 4:
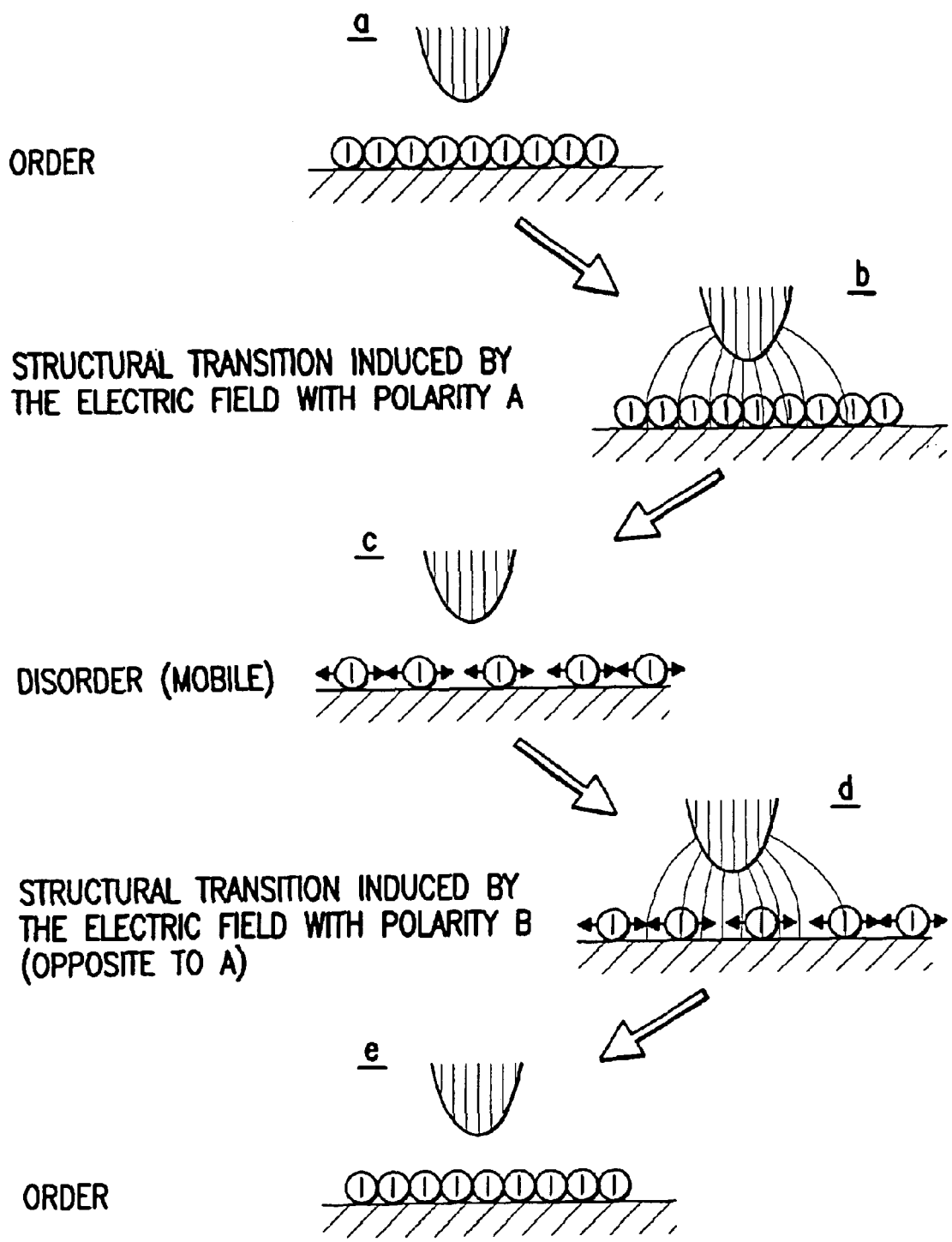
Figure 5A:
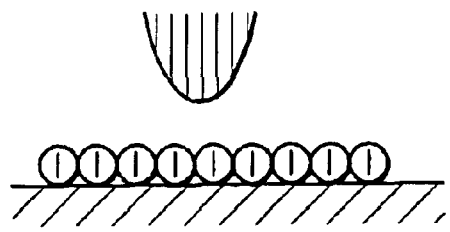
Figure 5B:
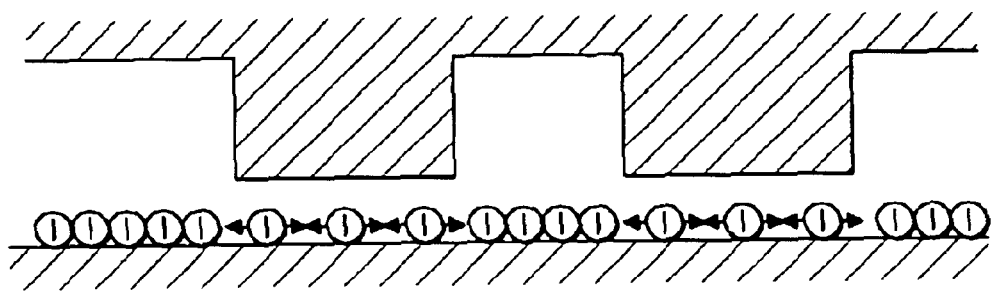
Figure 5C:
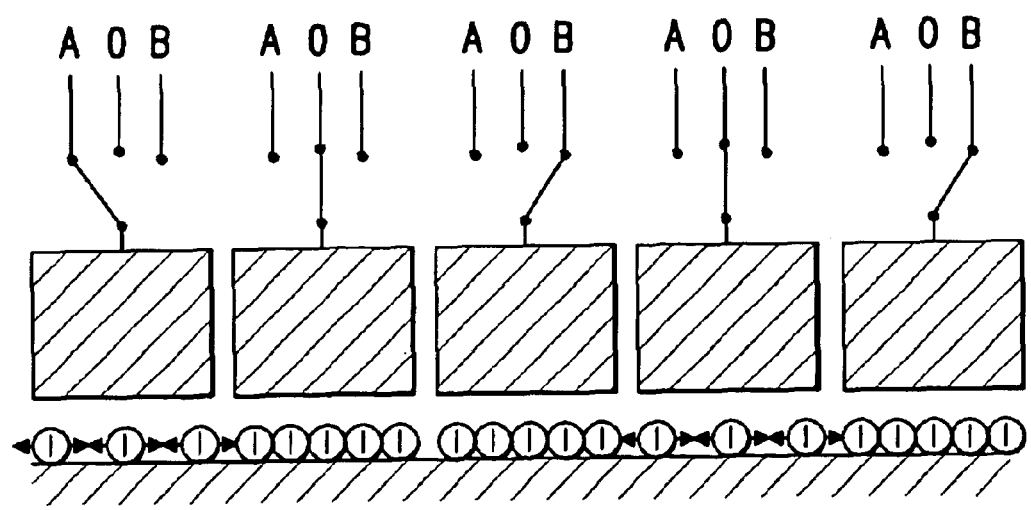

FIG. 4 shows that the structure of the molecular layers can be locally controlled by an electrode (e.g. SPM tip as shown in FIG. 5a or an array of electrodes as shown in FIG. 5b). Two different 2-dimensional structures can be created: (1) an ordered, crystalline structure as shown in FIG. 4a and (2) a disordered, non-crystalline structure as shown in FIG. 4c. A reversible transition (compare FIGS. 7b and 7d) between these two different structures can be controlled by an external influence, e.g. with an electric field of the STM tip as is shown in FIG. 7.

FIG. 4 schematically shows the reversible two-dimensional structural transition. With the different polarity A or B of the electric field of the electrode, the structural transition in the dipole layer can be reversibly controlled. In order to apply a sufficiently strong electric field to the dipole layer, the electrode is charged to a magnitude of about 1–2 volts and positioned so as to be near the dipole layer, preferably about 5 Å from the surface of the dipole layer. It is noted that electric fields with different polarity A or B may also have different magnitudes. For instance, it may take more energy to transform the dipole layer into the disordered, non-crystalline structures than to transform the dipole layer into the ordered, crystalline structures. In this case, when an external electric field is applied to the dipole layer, only that component of the electric field that is either parallel or anti-parallel with the component of the permanent electric dipole moment perpendicular to the substrate surface, as evident from FIG. 4, can effect structural transformation. Specifically, when the magnitude of the parallel component of the external electric field of polarity A, (i.e., that component of the electric field parallel with the perpendicular component of the dipole moment), is sufficient, then the dipole layer transforms into the ordered, crystalline structure. On the other hand, when the magnitude of the anti-parallel component of the external electric field of polarity B, (i.e., that component of the electric field anti-parallel with the perpendicular component of the dipole moment), is sufficient, then the dipole layer transforms into the disordered, non-crystalline structure.

The 2D-crystalline Cl-SubPc structure shown in FIG. 4b is obtained, e.g. by scanning with an STM, in a small area of about 10 nm diameter using an electric field of positive polarity A. The disordered structure shown in FIG. 4d is obtained by scanning with negative polarity B. Imaging, such as provided in FIGS. 7a and 7c, is subsequently done by scanning overview images. Preferably, all 2-dimensional structural transitions can be performed at room temperature, where the two different structures, ordered and disordered, are intrinsically stable and the structural transition can be controlled by the electrode.

The different structures, ordered and disordered, remain stable after this transition sequence shown in FIG. 7. Once transition has occurred, the electric field of the electrode is not needed to stabilize the 2-dimensional dipole structure. Both structures, ordered and disordered, are stable (i.e., there is no energy flow needed to keep the structures stable). For a Cl-SubPc dipole layer on Ag(111), the size of these 2D structures is on the order of 40 nm. With this structural transition property, a controlled change of local surface properties of the dipole layer disposed on the substrate can be achieved. Memory devices manufactured using a SubPc dipole layer in accordance with the present invention are electrically addressable, thereby permitting effective reading and writing and provide a high memory density (e.g. about $10^{12}$ bits/inch$^2$).

In summary, the essential steps needed for manufacturing a memory storage device in accordance with the present invention and as discussed above are as follows: (a) creating a substrate that is possibly prepatterned; (b) depositing the molecules having a permanent electric dipole; (c) bringing the electrode in close electrical contact; and (d) writing (using the electrode)/reading (e.g. STM, optical reader, etc.). In the present context, electrical contact does not necessarily require physical contact when the electrical field is sufficient in magnitude to effect a structural transition.

Writing to the Storage Device

Figure 8:
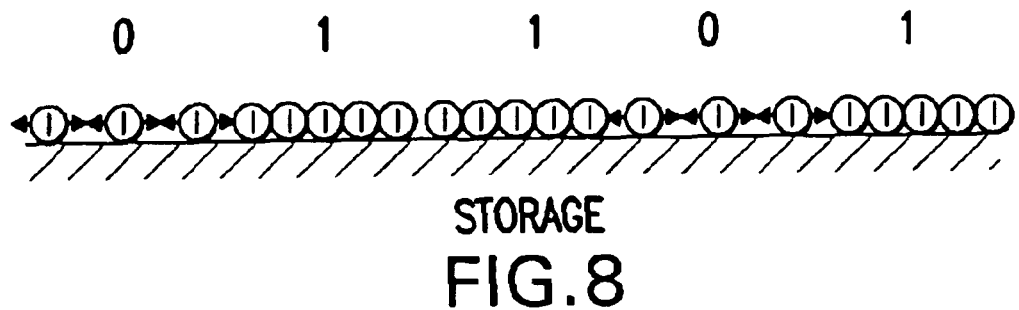
FIG. 8 schematically illustrates a storage medium application of the present invention, wherein the structural transition of a dipole layer is used to store data by assigning the bit structure "1" to a first one of the structures (i.e., the two-dimensional ordered structure) and "0" to the second structure (i.e., the two-dimensional disordered structure), or vice versa.

Molecules (1) with a permanent dipole moment (2), such as shown in FIG. 1, can be influenced by the electric field of a local probe (e.g. a SPM tip). By changing the polarity and the strength of the electric field applied between the probe and substrate sample, the diffusion of the molecules on the surface can be influenced as shown in FIG. 4. The effect of ordering and disordering can be used in a storage device as shown in FIG. 8. The ordered structure can, for example, be assigned as a bit "1," and the disordered structure as a bit "0," or vice versa. It is therefore possible to code a certain bit-sequence with ordered and disordered patches, as exemplified in FIG. 6. Eventually, the electrode can be moved during the writing process to trigger the structural transition between ordered and disordered states, and vice versa.

Reading from the Storage Device

The written data can be read out from the memory storage device shown in FIG. 6 because the ordered patterns have different properties than the disordered ones. For example, the symmetry, nearest-neighbor distance, diffusion rate, transmission coefficient, reflection coefficient, thermal and electrical conductivity probably are specific to the state of the structure and thus of the written bit. Read out could be performed therefore by utilizing optical or electrical methods. For example, a STM may be used to observe the molecular dipole layer, and can be used to identify the bit after imaging an active area (i.e., a portion of the memory storage device presently in use to store data). Small areas of ordered structure are assigned a bit of 1, whereas small areas of disordered structure have no observable condensed structure and are assigned a bit of 0.

Advantages of Memory Storage in Accordance with the Invention

The advantage of a memory storage system, which uses two-dimensional structures that consist of a mono-molecular layer of a species with a permanent electric dipole moment in accordance with the present invention, is that "writing" and "erasing" is performed by the electric field, which can be locally controlled such as with a tip of a SPM. Unlike prior art memory devices, the active area corresponding to a structural transition zone can be made very small, even up to the order of a few molecules or single atoms. This results in very small achievable structures (i.e., very small number of molecules, and small volume) and the transitional changes can be induced very locally (i.e., erase a single structure). The method of storing information is also important in the scaling-down of memory systems. The miniaturization also leads to low power consumption (in contrast, memory systems that use heat to override structures have a relatively high power consumption).

Because the electric field is used for both reversible "paths" of the transition (i.e., used to switch the structure from ordered to disordered and vice versa depending upon the polarity of the electric field), it is possible to reversible control (i.e., write) the structures many times in the very small areas using application of a local electric field and such data stored on the dipole layer can be retrieved (i.e., read) using an STM probe, an optical reader, or another suitable reading device. Because the different structures (i.e., ordered and disordered) are intrinsically stable, no power consumption is needed to keep the structures stable.

A layered medium, such as is provided by the second apparatus embodiment in accordance with the present invention, is in the form of a complete monolayer and has the advantage that it forms a dense film, which effectively protects the underlying substrate. Incomplete monolayers, such as occur when portions of the molecular dipole layer are in a disordered state, and therefore are removable, have the advantage that portions of the substrate can be functionally exposed. This feature can be used in manufacturing of patterned substrates by providing access to these exposed portions of the substrate to a modifying medium even without requiring removal of the layered medium (i.e., the molecular dipole monolayer).

A layered medium, such as provided by the second apparatus embodiment, also has the advantage that the molecules of an incomplete monolayer, (i.e., a disordered monolayer), continuously vary their lateral position due to thermal excitation. Hence, these portions of the substrate are not permanently covered by molecules, (i.e. these disordered portions are exposed to the environment for certain periods of time and hence can be attacked by a modifying means during these periods. In the structures where the molecules form a complete monolayer (i.e., ordered structures), on the other hand, the substrate is functionally shielded from the influence of the environment as long as the monolayer has an ordered structure.

Of course, the reversible structural transition property of the dipole layer in accordance with the present invention can also be used to provide other useful devices and effects, which will be described as follows.

Switchable Mirror for Photons and other Reflectable Particles

Figure 9A:
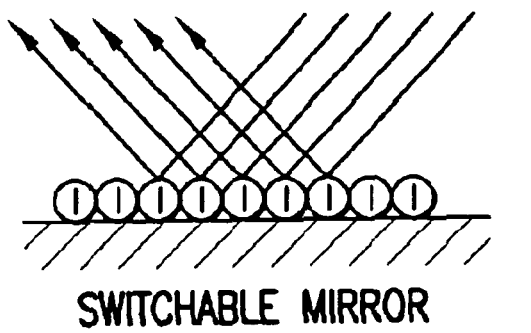
FIGS. 9a–b schematically illustrate a locally switchable mirror application of the present invention, wherein the structural transition of a dipole layer is used to change the reflectivity of a beam of photons, electrons, or other types of reflectable particles, by the dipole layer so that one structure of the layer (i.e., the two-dimensional ordered structure) reflects the beam as seen in FIG. 9a, whereas the second structure (i.e., the two-dimensional disordered structure) does not reflect the beam as shown in FIG. 9b.
Figure 9B:
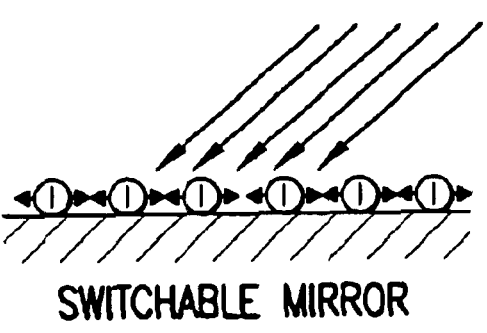

FIGS. 9a–b illustrate a locally switchable mirror wherein a dipole layer in accordance with the present invention is disposed on a substrate surface as described above. In this case, the ordered, crystalline structure of the dipole layer provides a reflective layer for reflecting photons and other reflectable particles as shown in FIG. 9a. Application of an electric field using an electrode so as to switch the dipole layer from the ordered, crystalline structure to a disordered, non-crystalline structure results in the loss of the reflective ability of the dipole layer as shown in FIG. 9b. In other words, the dipole layer ceases to be reflective when in the disordered, non-crystalline state. Of course, switching the polarity of the electrode can be performed so as to return the dipole layer to the reflective ordered, crystalline state.

Switchable Lubricant

Figure 10A:
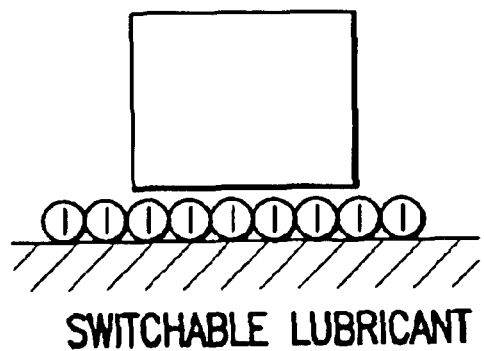
FIGS. 10a–b schematically illustrate a locally switchable lubricant application of the present invention, wherein the structural transition of a dipole layer is used to locally change the mechanical properties of the dipole layer so that in one state of the structure (i.e., the two-dimensional ordered structure as shown in FIG. 10a), the friction with an additional material is high, whereas in the second state (i.e., the two-dimensional disordered structure as shown in FIG. 10b) the friction is low.
Figure 10B:
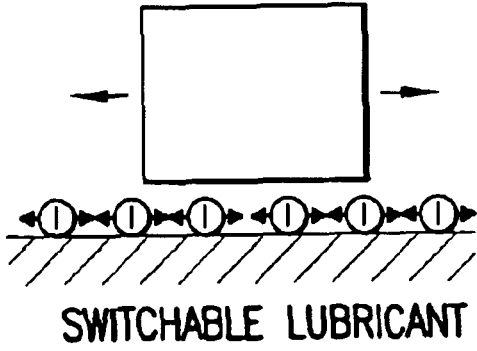

FIGS. 10a–b illustrate a locally switchable lubricant provided by a dipole layer in accordance with the present invention that is disposed on a substrate surface as described above. In this case, the ordered, crystalline structure of the dipole layer creates a high degree of friction between the substrate surface and a second material pressing against the substrate surface as shown in FIG. 10a. However, application of an electric field using an electrode so as to switch the dipole layer from the ordered, crystalline structure to a disordered, non-crystalline structure results in the dipole layer taking on lubricant properties so as to provide a low degree of friction between the substrate surface and the second material. Of course, reapplication of the electric field, but having a reversed polarity, can return the lubricating dipole layer back to the non-lubricating state.

Method for Patterning Molecular Layers

Figure 11:
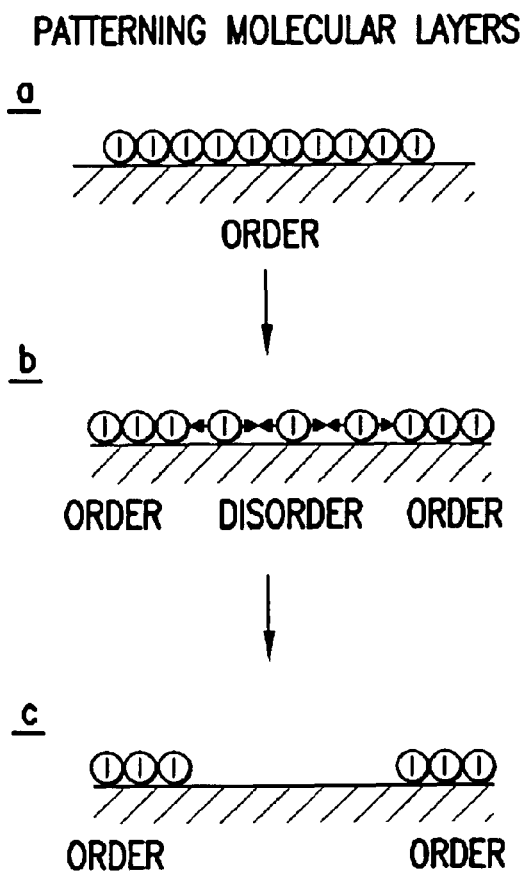

FIGS. 11a–c illustrate a lithographic application of the dipole layer in accordance with the present invention. Specifically, the dipole layer in accordance with the present invention can be deposited on a substrate surface as described above and ordered using an electric field having a positive polarity to provide an ordered, crystalline layer. Then, the molecular dipole layer can be patterned on the substrate surface by locally and selectively applying an electric field having a negative polarity so as to locally transform desired portions of the ordered molecular dipole layer to regions of disordered dipole layer. Next, the molecular dipole layer can be treated with irradiation, or by heating the substrate surface, or by chemically treating the molecular dipole layer so that only the disordered regions of the dipole layer are removed while the ordered regions remain intact. In this manner, a patterned molecular dipole layer may be formed on the surface of a substrate, thereby creating a lithographic pattern.

Method for Patterning a Substrate

Figure 12:
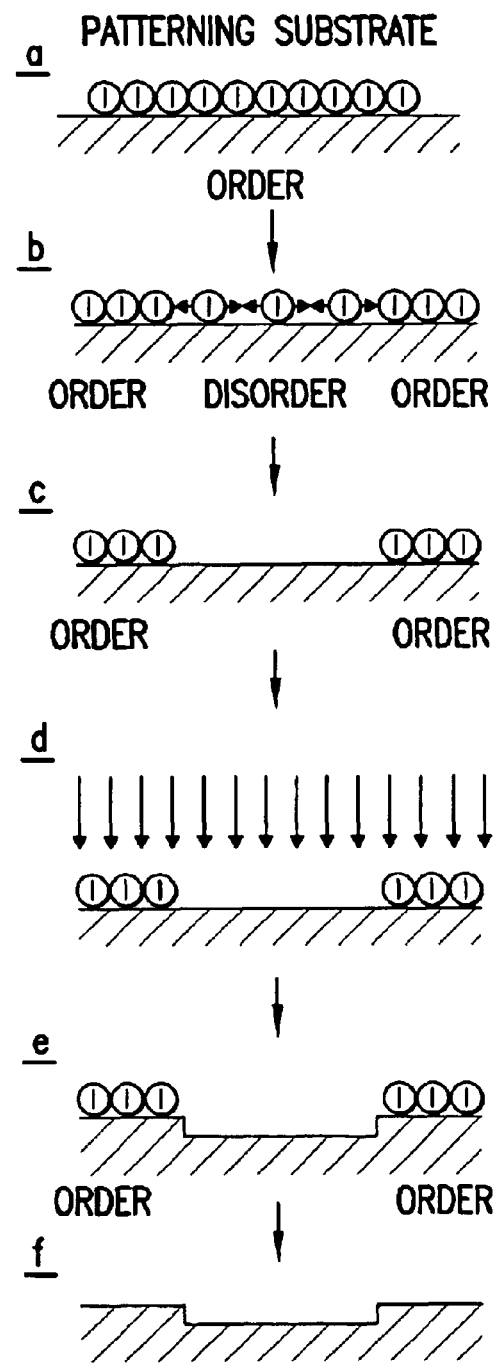
FIGS. 12a–f schematically illustrate a lithographic application for patterning substrates that includes as subsequent steps in a process of structuring the substrate, which is covered by a 2D dipole layer, layering a two-dimensional ordered structure on a substrate as shown in FIG. 2a, locally inducing a transition to form a disordered structure as shown in FIG. 2b, selectively removing the disordered structure by irradiation (i.e., by using particles, photons, etc.), or by heating or by chemical treatment as shown in FIG. 12c, exposing the sample to a modifying means (small arrows) that selectively attacks the uncovered areas of the substrate as shown by FIG. 12d, then stopping the exposure process after the desired depth is reached as shown in FIG. 12e, followed by removing the remaining molecules in the ordered structure by utilizing a selective etching process for removing the remaining molecules as shown in FIG. 12f.

FIGS. 12a–f illustrate steps in a method for forming a resist for lithography in accordance with another embodiment of the present invention. The method for forming a resist on a substrate includes the step of forming a two-dimensional molecular dipole layer on a substrate using one of the deposition methods described above, wherein the deposition method forms an ordered dipole layer as shown in FIG. 12a. Second, a negative polarity electric field is locally induced to cause a transition from ordered structure to disordered structure for portions of the dipole layer as shown in FIG. 12b. Next, the disordered portions of the molecular dipole layer are selectively removed by irradiation with photons or other radiation particles, or by heating, or by a chemical treatment as shown by FIG. 12c so as to leave behind only the ordered portions of the dipole layer. Subsequently, the substrate sample having only ordered portions of the dipole layer is exposed to a substrate modifying means as is known in the art, such as an acid etch or other equivalent means for modifying the exposed substrate surface, so as to selectively attack those areas of the substrate uncovered by the remaining ordered portions of the dipole layer. This step is stopped after a desired depth in the substrate is reached. Then, the remaining ordered portions of the dipole layer are removed by utilizing a selective etching process for removing the ordered dipole layer.

While the present invention has been described with reference to certain illustrative embodiments, one of ordinary skill in the art will recognize that additions, deletions, substitutions, modifications and improvements can be made while remaining within the spirit and scope of the present invention as defined by the appended claims.

What is claimed is:

1. A memory storage device comprising:
a substrate; and
a two-dimensional molecular dipole layer disposed on the substrate and provided by molecules having a permanent electric dipole moment, wherein the molecules of the dipole layer form different two-dimensional structures, wherein a first structure is an ordered structure and a second structure is a disordered structure.

2. A memory storage device as recited in claim 1, wherein the molecules having the permanent electric dipole moment are SubPc molecules.

3. A memory storage device as recited in claim 2, wherein the substrate comprises Ag(111).

4. A memory storage device as recited in claim 1, wherein the molecules having the permanent electric dipole moment are Cl-SubPc molecules.

5. A memory storage device as recited in claim 1, wherein the molecules having a permanent electric dipole moment have a large pi-electron system wherein the electrons are delocalized over several atoms.

6. A memory storage device as recited in claim 1, wherein the molecules having a permanent electric dipole moment are phthalocyanine molecules.

7. A memory storage device as recited in claim 1, wherein the molecules have permanent electric dipole moments of about 0.1 eÅ or greater.

8. A memory storage device as recited in claim 7, wherein the molecules have permanent electric dipole moments of about 1.0 eÅ.

9. A memory storage device as recited in claim 1, further comprising at least one electrode disposed near the dipole layer so that a local electric field is produced between the electrode and the substrate, wherein the local electric field has a first polarity that orders a first region of the dipole layer to form the first structure and the electric field is switchable to a second polarity that transforms the first region of the dipole layer to form the second structure.

10. A memory storage device as recited in claim 9, wherein the at least one electrode is disposed to be about 5 Å from the dipole layer and the electrode is charged to a magnitude of 1–2 volts.

11. A memory storage device as recited in claim 10, wherein the first polarity is essentially parallel with the electric dipole moment and the second polarity is essentially anti-parallel with the electric dipole moment.

12. A memory storage device as recited in claim 9, wherein the at least one electrode is a SPM tip or an STM tip.

13. A memory storage device as recited in claim 9, wherein the first region of the dipole layer is assigned bit structure of "1" when the first region is in the ordered state of the first structure and the first region is assigned bit structure of "0" when the first region is in the disordered state of the second structure, or vice versa.

14. A memory storage device as recited in claim 13, wherein the at least one electrode is movable to be disposed near a second region of the dipole layer so that when the local electric field has the first polarity the second region of the dipole layer is ordered to form the first structure and when the electric field is switched to the second polarity the second region of the dipole layer is ordered to form the second structure, wherein the second region of the dipole layer is assigned bit structure of "1" when the second region is in the ordered state of the first structure and the second region is assigned bit structure of "0" when the second region is in the disordered state of the second structure, or vice versa.

15. A memory storage device as recited in claim 9, wherein the first region is about 10–40 nm in diameter.

16. A memory storage device as recited in claim 1, wherein the ordered structure is a crystalline structure and the disordered structure is a non-crystalline structure.

17. A two-dimensional dipole layer disposed on a substrate, wherein the two-dimensional dipole layer comprises:
molecules having a permanent electric dipole moment and that adsorb to a surface of the substrate, wherein the molecules of the dipole layer form different two-dimensional structures that include a first structure and a second structure.

18. A two-dimensional dipole layer disposed on a substrate as recited in claim 17, wherein the first structure is an ordered structure and the second structure is a disordered structure.

19. A two-dimensional dipole layer disposed on a substrate as recited in claim 18, wherein the ordered structure is a crystalline structure and the disordered structure is either an amorphous structure or a mobile molecular structure or a two-dimensional gas.

20. A two-dimensional dipole layer disposed on a substrate as recited in claim 17, wherein the molecules are SubPc molecules.

21. A two-dimensional dipole layer disposed on a substrate as recited in claim 17, wherein the molecules are Cl-SubPc molecules.

22. A two-dimensional dipole layer disposed on a substrate as recited in claim 17, wherein the substrate is a metallic, semi-conducting or insulating substrate.

23. A two-dimensional dipole layer disposed on a substrate as recited in claim 22, wherein the substrate is Ag(111).

24. A two-dimensional dipole layer disposed on a substrate as recited in claim 17, wherein the electric dipole moment is about 0.1 eÅ or greater.

25. A two-dimensional dipole layer disposed on a substrate as recited in claim 17, wherein molecules of a first region of the dipole layer switch from the first structure to the second structure when exposed to an electric field component having a first polarity anti-parallel with a component of the dipole moment perpendicular to the substrate surface and wherein molecules of the first region of the dipole layer switch from the second structure to the first structure when exposed to an electric field component having a second polarity parallel with the component of the dipole moment perpendicular to the substrate surface.

26. A method of manufacturing a memory storage device comprising the steps of:
creating a substrate that includes a prepattern;
depositing molecules that have a permanent electric dipole moment onto the surface of the prepatterned substrate so as to form a two-dimensional dipole monolayer, wherein the molecules of the dipole monolayer form different two-dimensional structures that include a first structure and a second structure, wherein the first structure is an ordered, crystalline structure and the second structure is a disordered, non-crystalline structure; and
applying a local electric field to one or more regions of the dipole monolayer, wherein application of an electric field component having a first polarity essentially parallel to the electric dipole moment component, which is perpendicular to the surface of the prepatterned substrate, transforms a corresponding region into the ordered structure whereas application of an electric field component having a second polarity essentially anti-parallel to the electric dipole moment component perpendicular to the surface of the prepatterned substrate transforms the corresponding region into the disordered structure.

27. A method of storing data comprising the steps of:
providing a memory storage device manufactured in accordance with the method of claim 26; and
applying the local electric field to one or more regions of the dipole monolayer so as to write data onto the dipole monolayer, wherein regions that have ordered structure are assigned a bit structure of "1" and regions that have disordered structure are assigned a bit structure of "0", or vice versa.

28. A method according to claim 27, further comprising the step of reading data from the dipole monolayer using an STM probe or an optical or electrical reader.

29. A memory storage device comprising:
a substrate;
a two-dimensional molecular dipole layer disposed on the substrate and provided by molecules having a permanent electric dipole moment, wherein the molecules of the dipole layer form different two-dimensional structures, wherein a first structure is an ordered structure and a second structure is a disordered structure; and
at least one electrode disposed near the dipole layer so that a local electric field is produced between the electrode and the substrate, wherein the local electric field has a component that has a first polarity and a first field strength that orders a first region of the dipole layer to form the first structure and the local electric field is switchable to have a component that has a second polarity and a second field strength that transforms the first region of the dipole layer to form the second structure.

30. A two-dimensional dipole layer disposed on a substrate, wherein the two-dimensional dipole layer comprises:
molecules having a permanent electric dipole moment and that adsorb to a surface of the substrate, wherein the molecules of the dipole layer form different two-dimensional structures that include a first structure and a second structure, wherein the dipole moment has a component perpendicular to the surface of the substrate, and wherein application of a first electric field to the dipole layer so that a component of the first electric field is parallel with the perpendicular component of the dipole moment transforms the dipole layer into the first structure, whereas application of a second electric field to the dipole layer so that a component of the second electric field is anti-parallel with the perpendicular component of the dipole moment transforms the dipole layer into the second structure.

31. A two-dimensional dipole layer disposed on a substrate as recited in claim 30, wherein the first structure is an ordered crystalline structure and the second structure is a non-ordered, non-crystalline structure.

32. A two-dimensional dipole layer disposed on a substrate as recited in claim 31, wherein the parallel component of the first electric field has a first electric field strength and the anti-parallel component of the second electric field has a second electric field strength.

33. A two-dimensional dipole layer disposed on a substrate as recited in claim 32, wherein the first electric field strength is different in magnitude from the second electric field strength.

34. A two-dimensional dipole layer disposed on a substrate, wherein the two-dimensional dipole layer comprises:
molecules having a permanent electric dipole moment and that adsorb to a surface of the substrate, wherein the molecules of the dipole layer form different two-dimensional structures that include a first structure and a second structure, and wherein the first structure can be repeatedly transformed into the second structure, and vice versa, under the influence of an external probe.

35. A two-dimensional dipole layer disposed on a substrate as recited in claim 34, wherein the external probe is used to apply an electric field, or an electromagnetic field, or a magnetic field.

36. A two-dimensional dipole layer disposed on a substrate as recited in claim 34, wherein the external probe is an electrode and is used to apply an electric field.

* * * * *